United States Patent
Harrabi

(10) Patent No.: US 11,441,954 B2
(45) Date of Patent: Sep. 13, 2022

(54) METHOD, SYSTEM AND APPARATUS FOR MEASURING REST TIME OF SUPERCONDUCTING NANOWIRE

(71) Applicant: KING FAHD UNIVERSITY OF PETROLEUM AND MINERALS, Dhahran (SA)

(72) Inventor: Khalil Harrabi, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 621 days.

(21) Appl. No.: 16/261,764

(22) Filed: Jan. 30, 2019

(65) Prior Publication Data

US 2020/0240847 A1 Jul. 30, 2020

(51) Int. Cl.
*H01L 39/02* (2006.01)
*G01K 3/14* (2006.01)
(Continued)

(52) U.S. Cl.
CPC ............... *G01K 3/14* (2013.01); *G01K 7/16* (2013.01); *G01N 25/18* (2013.01); *H01L 39/02* (2013.01);
(Continued)

(58) Field of Classification Search
CPC ....... H01L 39/02; H01L 39/12; H01L 39/125; H01L 39/143
See application file for complete search history.

(56) References Cited

U.S. PATENT DOCUMENTS

| 9,577,175 B1 | 2/2017 | Nam et al. |
| 9,964,446 B2 | 5/2018 | Gunnarsson et al. |
| 2008/0026946 A1* | 1/2008 | Yamasaki ............... H01L 39/16 427/62 |

FOREIGN PATENT DOCUMENTS

| CN | 104183692 A | 12/2014 |
| CN | 105870315 A | 8/2016 |
| WO | WO 2014/197047 A2 | 11/2014 |
| WO | WO 2014/197047 A3 | 11/2014 |

OTHER PUBLICATIONS

E. Ghisetti, et al. "Germanium on silicon single-photon avalanche detectors using silicon-on-insulator substrates (Conference Presentation)", Proceedings, vol. 10535, Mar. 14, 2018, p. 1 (Abstract Only).

(Continued)

*Primary Examiner* — Paul A Wartalowicz
(74) *Attorney, Agent, or Firm* — Oblon, McClelland, Maier & Neustadt, L.L.P.

(57) ABSTRACT

A device, system and method for measuring the temperature at the center of a normal hotspot and the heat escape time in superconducting filament or nanowire toward the substrate. The device includes structured layers; a superconducting filament is implemented as an active layer where an electrical current pulse or single photon radiation generates a hot spot; a sensitive semiconductor layer of germanium serves as a temperature sensor (thermometer); and a thin layer of insulating silicon oxide is intercalated between the superconducting layer and the germanium having a thickness in the range of 2-10 nm and width 5-100 μm. This device provides a direct measurement of the temperature at the center of a hot spot and determination of the heat escape time toward a substrate; and can be used to determine the sensitivity of a superconducting single photon detector device to a next upcoming photon.

12 Claims, 3 Drawing Sheets

(51) Int. Cl.
  G01K 7/16    (2006.01)
  G01N 25/18   (2006.01)
  H01L 39/24   (2006.01)
  H01L 39/12   (2006.01)
  H01L 39/14   (2006.01)

(52) U.S. Cl.
  CPC ............ *H01L 39/12* (2013.01); *H01L 39/125* (2013.01); *H01L 39/143* (2013.01); *H01L 39/2403* (2013.01); *G01K 2003/145* (2013.01)

(56) References Cited

OTHER PUBLICATIONS

C. Natarajan et al. "Superconducting nanowire single-photon detectors: physics and applications" Superconductor Science and Technology, vol. 25, 2012, pp. 1-17.

K. Harrabi, "Hotspot Temperatures Reached in Current-Driven Superconducting Niobium Filaments" Springer, vol. 26, 2013, pp. 1865-1868.

K. Harrabi et al., "Phonon Escape Time Deduced From the Time of Nucleation of Hot Spots in Superconducting Niobium Filaments" IEEE Transactions on Applied Superconductivity, vol. 26, Issue 3, Apr. 2016, pp. 1-4.

K. Harrabi, "Temperature Dependence of the Heat Escape Time Deduced From the Nucleation of a Dissipative Zone in Superconducting YBa2Cu3O7 Filament" IEEE Transactions on Applied Superconductivity, vol. 26, Issue 3, Apr. 2016, pp. 1-3.

G. Berdiyorov et al., "Effect of pinning on the response of superconducting strips to an external pulsed current" Superconductor Science and Technology, vol. 28, 2015, pp. 1-9.

K. Harrabi et al., "Temperature Elevation of Current-Driven Phase-Slip Centers in YBa2Cu3O7 Strips" Springer, vol. 28, 2014, pp. 573-577.

K. Harrabi et al., "Resistive states created in superconducting NbTiN filaments by an electrical current pulse" AIP Advances, vol. 5, Issue 037102, 2015, pp. 1-7.

\* cited by examiner

METHOD, SYSTEM AND APPARATUS FOR MEASURING REST TIME OF SUPERCONDUCTING NANOWIRE

BACKGROUND OF THE INVENTION

Field of the Invention

The invention falls within the fields of physics and electronics. It relates to a device for measuring hotspot temperature and heat escape time from a hotspot to a substrate in a superconducting wire.

Description of Related Art

An important objective during the past decade has been to improve the accuracy and sensitivity of superconducting nanowire single photon detectors (SNSPD). However, the sensitivity of such detectors to single photon detection and the reset or recovery time for such detectors necessary to regain sensitivity to subsequent detection of photons remains a challenge. Efforts have been oriented toward the detection of infrared wavelengths useful in optical quantum information technologies.

Conventional single photon detectors use various superconducting materials such, NbN, NbTiN and a promising candidate YBCO which are deposited on different substrates such as SiOx, sapphire, or MgO. For SiOx, x is a real number greater than 0 and smaller than or equal to 2.

In single photon detectors, the heat escape time (phonon escape time) is an important parameter since it contributes to determining the recovery time of the detection processing applications related to optical communication protocols; C. M. Natarajan, M. G. Tanner, and R. H. Hadfield, Supercond. Sci. Technol. 25, 063001 (2012) *Superconducting nanowire single-photon detectors: physics and applications*. Such single photon detectors which are based on detection of a hot spot in a superconducting nanowire are described by Goltsman G. N., et al Appl. Phys. Lett. 79 7057 (2001); Tang H., et al., US20140299751A1. However, conventional detectors are limited because sensitivity of the detector is time dependent.

After photon absorption the normal hot spot segment of a superconducting nanowire relaxes to a superconducting state and the voltage disappears within a certain time $\tau_{es}$, called the reset time of the SNSPD. During this rest time the SNSPD is not able to register additional photon impacts until it has returned to its cooled, superconducting state; M. Ejrnaes, et al, Appl. Phys. Lett 95, 132503 (2009). Moreover, many interactions occur during relaxation from the normal non-superconducting state to the superconducting state, including electron-electron and electron-phonon interactions. Heat evacuation toward the substrate is governed only by the phonons and depends on the film substrate interface.

The measurement of the heat escape time (reset time) of the SNSPD was reported by Tarkhov et al., 92, 241112 (2008) using an Ultrathin NbN film superconducting single-photon detector array consisting of N parallel superconducting stripes. Stockhausen, K. Il'in, M. Siegel, U. Sadervall, P. Jedrasik, A. Semenov, and H.-W. Hubers, Supercond. Sci. Technol. 25, 035012 (2012) describe determination of the hotspot current (hysteresis current) experimentally in NbN film, using the specific heat in the Debye regime and fixing the temperature reached at the center of hotspot to the critical temperature. However, the relaxation process from the normal to the superconducting state was not measured experimentally and empirical methods were used where different process mechanisms were involved including phonon scattering and phonon-phonon interactions.

The phenomena of non-equilibrium superconductivity is the subject of various studies and their application for the single photon detection using superconducting nanowire is described by G. N. Gol'tsman, O. Okunev et al, C. Williams and Roman Sobolewski, *Picosecond superconducting single-photon optical detector*, App. Phys. Lett. 79, 705 (2001); D. Y. Vodolazov, Phys. Rev. Appl. 7, 034014 (2017); and S. Miki, M. Takeda, M. Fujiwara, M. Sasaki, A. Otomo, and Z. Wang, Appl. Phys. Express 2, 075002 (2009).

Harrabi et al. reported on the measurement of the heat escape time in Nb, YBCO and NbTiN using a current pulse technique. The delays for different applied current values over the critical value in response to an electrical current pulse were measured and fitted to the delay time with the time dependent Ginzburg-Landau equation. The pre-factor preceding the integral $\tau_d$ in the delay time $t_d$ as a function of the applied current was identified as the heat escape time which was related to phonon escape time through $\tau_{es} = \tau_d (C_e + C_{ph})/C_{ph}$ where $C_e$ and $C_{ph}$ are the specific heat of the electrons and phonons respectively.

The destruction of the superconductivity in a localized hotspot zone leads to transition of the superconducting filament to a normal state where the energy dissipation occurs. An excess of quasi-particles are believed to be responsible for this phenomenon. The phase-slip center (PSC) is expected to occur as a dissipation in one-dimensional filaments; M. Tinkham, *Introduction to Superconductivity*, 2nd edition, (McGraw-Hill, Singapore, 1996). Where the alteration in time of the order parameter between zero and one corresponding to superconducting and normal components in this zone, the phase difference of the order parameter changes by a quantum of $2\pi$ each time the superconducting gap drops to zero. Non-equilibrium quasi-particles generated during this cycle diffuse over an inelastic diffusion length setting the dimension of the PSC. A second alternative for dissipation occurs by overheating of the filament leading to the formation of a localized normal state or hot spot (HS); W. W. Webb, and R. J. Warburton, Phys. Rev. Lett. 20, 461 (1968); J. D. Meyer, Appl. Phys. 2, 303 (1973); W. J. Skocpol, M. R. Beasley, M. Tinkham, J. Low Temp. Phys. 16, 145 (1974); and F-S Jelila, J-P Maneval, F-R Ladan, F. Chibane, A. Marie-de-Ficquelmont, L. Mechin and J-C Villégier, M. Aprili and J. Lesueur, *Time of Nucleation of Phase-Slip Centers in YBa2Cu3O7 Bridge*, Phys. Rev. Letters 81, 1933, 1998—each incorporated herein by reference in its entirety.

A HS is essentially a normal zone maintained above the critical temperature by the Joule effect. Once the heat is generated in the normal (non-superconductive) zone, it propagates along the filament by thermal conduction and is also evacuated to the substrate by surface heat transfer.

The heat transfer toward the substrate is maintained by phonon radiation through the interface. The estimated temperature reached at the center of a niobium filament is described by Ladan and Harrabi, et al., J. Low Temp. Phys. 153, 103 (2008); and by G. Berdiyorov, K. Harrabi, F. Oktasendra, K. Gasmi, A. I. Mansour, J. P. Maneval, and F. M. Peeters, *Dynamics of current-driven phase-slip centers in superconducting strips*, Phys. Rev. B 90, (2014) 134505 and high temperature superconductor YBCO; K. Harrabi, F. R. Ladan, Vu Dinh Lam, J.-P. Maneval, J.-F. Hamet, J.-P. Villégier, and R. W. Bland, J. Low Temp. Phys. 157, 36 (2009); K. Harrabi, *Temperature Elevation of Current-*

*Driven Phase-Slip Centers in $YBa_2Cu_3O_7$ Strips*. J. Supercond. Nov. Magn. 28, 573 (2015).

Moreover, the studies of HS and PSC were reported in superconducting NbTiN filaments; K. Harrabi, *Resistive states created in superconducting NbTiN filaments by an electrical current pulse* AIP ADVANCES 5, (2015), 037102; K. Harrabi, A. Mekki, S. Kunwar, and J. P. Maneval, J. Appl. Phys. 123, 083901 (2018). Pulse measurement of the hot spot current in a NbTiN superconducting filament.

In these studies, the temperature was calculated from joule dissipation based in part on blackbody radiation power density in the Debye regime. In the calculation for Nb, the phonon time escape is deduced by fitting the measurement of the delay time of the nucleation of HS or PSC as a function of the applied current with the time dependent Ginzburg Landau equation; K. Harrabi, F. Oktasendra, K. Gasmi, G. Berdiyorov, A. Mekki, and J. P. Maneval, *Phonon escape time deduced from the time of nucleation of hot spots in superconducting niobium Filaments*, IEEE Trans. Appl. Supercond. 26, 7399353 (2016). In the case of a YBCO filament, the phonon time escape was deduced similarly from the nucleation of the hotspot; K. Harrabi, *Temperature dependence of the heat escape time deduced from the nucleation of a dissipative zone in superconducting $YBa_2Cu_3O_7$ Filament*, IEEE Trans. Appl. Supercond, 26, 7397940 (2016)—incorporated herein by reference in its entirety.

Recently an experiment extracted the heat escape time from a NbTiN filament; K. Harrabi, F. O. Bakare, F. Oktasendra, J. P. Maneval, *Temperature Dependence of the Phonon Escape Time Deduced from the Nucleation Time of Phase Slip Center in Superconducting NbTiN Thin Film*, 30, 5, 1349 (2017). However, a reliable method for measuring the rest time of a superconducting nanowire remains elusive.

Accordingly, it is one object of the present disclosure to provide a method and system for measuring the rest time of a superconducting nanowire based on hot spot nucleation. In particular, the present disclosure describes a method determining the temperature reached at the center of a hotspot by measurement of an electrically insulated germanium layer (or other metallic, metallic oxide or semiconducting layer) in conjunction with a measurement of the heat escape time into a substrate. By interposing an electrically insulating thin layer of SiOx to isolate the Ge layer a reliable thermometer/temperature sensor is provided that measures hotspot temperature by increased resistance caused by leakage of hotspot heat through the SiOx layer.

BRIEF SUMMARY OF THE INVENTION

The invention is directed to a device for measuring hotspot temperature and heat escape time from a superconducting filament, wire or nanowire.

Another aspect of the invention is a for accurately and easily measuring hotspot temperature, heat escape time and/or reset or recovery time for a superconducting filament to return to its initial superconducting condition after formation of a hotspot, for example, after detection of a photon by a detection device.

Still another aspect is a method for selecting a suitable material or suitable configuration of a superconducting material for use in a detector, such as a single photon detector by incorporating the superconducting material into the device disclosed herein and selecting a superconducting material for use in a detection devise based on its recovery time (or time to regain its superconducting state) after detecting a photon.

An additional aspect of the invention is a method for making the device described herein.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings below.

DETAILED DESCRIPTION OF THE INVENTION

Figure 1A:
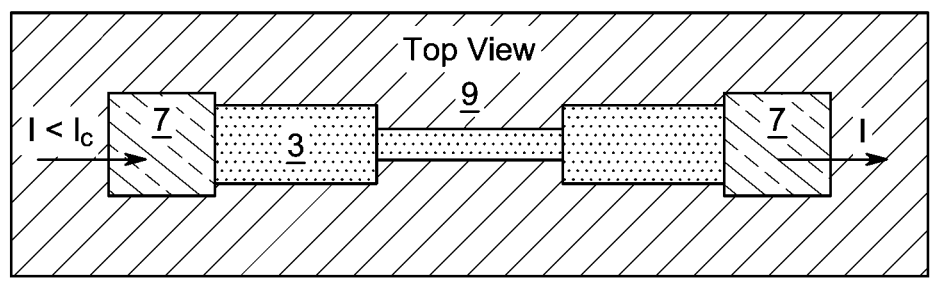
FIG. 1A. Top view of the superconducting active layer, the wire has a narrower width right at the middle to enhance the formation of hotspot and in which the entire wire is in the superconducting state for I<Ic.

The present disclosure describes an invention that includes a device and methods for measurement of the temperature of a hotspot formed in an otherwise superconducting filament, wire, nanowire, or film, as well as methods for measuring heat escape time or the time that it takes heat from a formed hotspot (dissipative normal, non-superconducting zone) to escape from the otherwise superconducting filament into a substrate. The present disclosure also provides a method for testing and comparing heat escape times for different kinds of superconducting materials.

As used herein, unless otherwise specified, the terms "filament", "wire" and "nanowire" refer to essentially one dimensional objects which may be thinner in the middle than at their ends to localize a hotspot induced by a pulse of electrical current. The term "film" may be used and typically refers to a more two dimensional material.

In one aspect, the invention employs different structured layers, an active layer comprising or consisting of a superconducting filament, such as a filament of Nb, NbTi, NbTiN, YBCO, or another superconducting material, where an electrical current pulse, such as a pulse of 1, 2, 5, 10, 20, 50, 100, 200, 500 or 1,000 ns or >1 s (or any intermediate value within this range), is used as an excitation above the critical current $I_c$. This pulse is selected to induce generation of a dissipative localized spot (normal zone) or "hotspot" along the filament with a length of few micrometers, such as 0.5, 1, 2, 3, 4, 5, 6, 7, 8, 9 or 10 micrometers. This pulse plays a similar role to single photon radiation in that it excites a segment of the superconductive filament which temporarily loses its superconductive properties. This loss of superconductivity is measured as a way to detect single photon radiation. Consequently, the temperature at the center of the hotspot will exceed the substrate temperature and the transition temperature of the filament. In the invention, a germanium layer deposited on top of a SiOx insulator with a thickness varying between 2 and 10 nm serves as a thermometer. This thin $SiO_x$ layer is placed or sandwiched between a superconducting layer and the germanium layer and electrically isolates the germanium from the active layer. In other embodiments of the invention other temperature responsive materials other than germanium may be used as temperature sensors or thermometers in a manner similar to that of germanium. These materials include, but are not limited to, relative sensors such as Si or metallic oxides, or materials whose resistance is dependent on temperature such as materials used in thermistors including PTC (e.g., barium titanate) and NTC thermistor materials (e.g., sintered metal oxides like ferric oxide with titanium or nickel oxide with lithium); see https://_en.wikipedia.org/wiki/Thermistor (last accessed Jan. 23, 2019, incorporated by reference). In some embodiments an electrical insulator other than $SiO_x$ may be used.

The germanium layer may be calibrated as a thermometer or temperature sensor by measuring the variation in its resistance in response to temperature changes when the filament is in a superconducting state. Typically no bias current, which could perturb Ge resistance, is applied during calibration. Subsequently, an increase of the resistance of the germanium layer when a hotspot is induced or otherwise occurs in a superconducting filament provides a reading of the temperature in the center of a hotspot zone in the filament. After hotspot induction, phonons evacuate the hotspot heat within lag time $\tau_{es}$. During this lag time, a conventional single photon detector, which detects single photons by loss of a superconducting state in a filament, is insensitive to additional incoming photonic radiation because it is not in its initial superconducting state.

After hotspot formation the energy dissipated during the lag time before the filament regains its initial superconductive state is equalized to the energy evacuated by the phonon toward the substrate. The energy evacuated by the phonon into the substrate may be determined using the phonon specific heat constants in the Debye regime which are known for each superconducting material. The heat escape time can be determined accurately from the equation above without any adjustable parameter. These constants are described by and incorporated by reference to Experimental determination of heat capacities and their correlation with theoretical predictions Am. J. Phys. 79, 1099 (2011); doi: 10.1119/1.3625869; https://_en.wikipedia.org/wiki/Debye_model.

In the present invention an electrical current pulse creates a hotspot; however, unlike Ladan and Harrabi, et al., J. Low Temp. Phys. 153, 103 (2008), the present disclosure describes a different approach to determine the heat escape time. For example, once a critical current for a superconducting material has been exceeded, a hot spot or dissipative zone appears and a voltage signal is detected after a delay time $t_d$. The temperature in the dissipative zone or hotspot (normal, non-superconductive zone) is higher than that of the substrate temperature which is typically at or below transition temperature $T_c$.

A dissipative zone appears when the critical current value is exceeded and a voltage signal is detected after a certain delay time $t_d$. The temperature in this new normal non-superconductive zone is higher than the substrate temperature and higher than transition temperature T.

In the invention, a SiOx layer is disposed on, grown on or otherwise applied to the top of the superconducting filament to electrically isolate the germanium temperature sensor from the hotspot. A sample with structured layers is preferably used, e.g., an active layer that consists of a superconducting thin filament grown or otherwise provided on a suitable substrate. When these materials are cooled below their critical temperature $T_c$, their resistance drops to zero accompanied by a change in phase from normal state to superconducting state.

Below this temperature Tc, sending an electrical current pulse amplitude with a value larger than the critical current, destroys superconductivity at a weakest point by formation of a hotspot. Typically superconductivity is destroyed in the middle of a perfect filament or at the weakest or narrowest point of a filament.

Figure 1B:
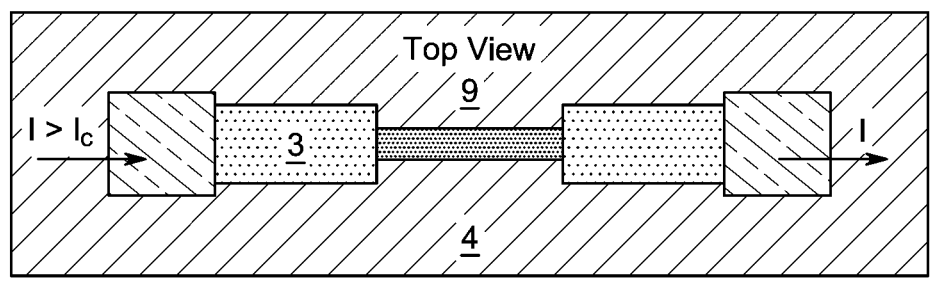
FIG. 1B. Top view of the superconducting active layer, the wire has a narrower width at the middle to enhance the formation of hotspot and for an applied current I>Ic, the central part turns to hotspot and represented by the red color, and the yellow squares are the gold contacts. The superconducting part is shown in gray.

Another alternative of hotspot generation in superconducting nanowire applies to the absorption of single photon radiation. The superconducting filament or layer (3) is designed such that it has a narrow width at the middle (9) where the destruction of the superconductivity is expected to be as shown by FIGS. 1A and 1B. FIG. 1A shows the superconducting filament (3) and a narrowed portion of the filament (9) connected to two terminals (7). Upon generation of a hotspot (4) as shown by FIG. 1B superconductivity is destroyed.

The normal zone appears after a certain delay time $t_d$, where its temperature rises above the critical temperature; K. Harrabi, *Hotspot Temperatures Reached in Current-Driven Superconducting Niobium Filaments*, J. Supercond. Nov. Magn. 26, 1865 (2013). G. Berdiyorov, K. Harrabi, F. Oktasendra, K. Gasmi, A. I. Mansour, J. P. Maneval, and F. M. Peeters, *Dynamics of current-driven phase-slip centers in superconducting strips* Phys. Rev. B 90, (2014) 134505. K. Harrabi, F. R. Ladan, Vu Dinh Lam, J.-P. Maneval, J.-F. Hamet, J.-P. Villégier, and R. W. Bland, J. Low Temp. Phys. 157, 36 (2009). K. Harrabi, *Temperature Elevation of Current-Driven Phase-Slip Centers in $YBa_2Cu_3O_7$ Strips*. J. Supercond. Nov. Magn. 28, 573 (2015)—each incorporated herein by reference in its entirety.

Figure 2:
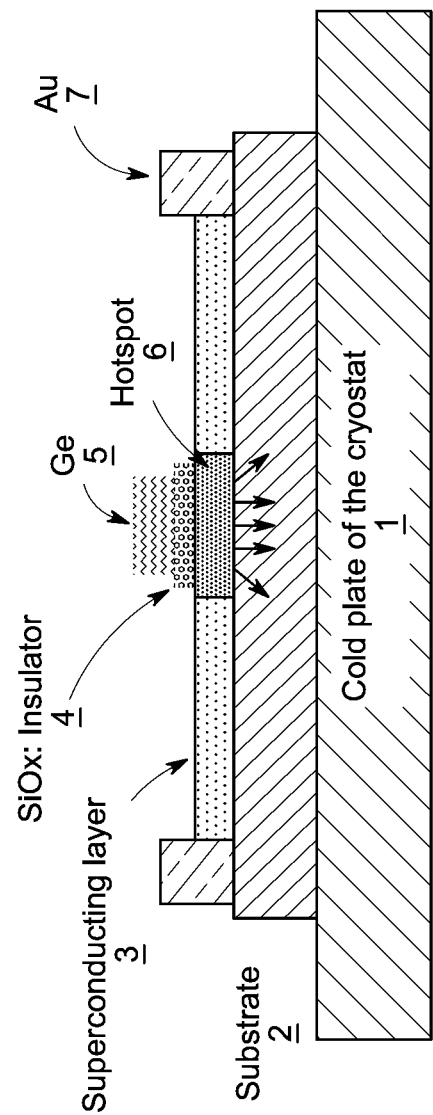
FIG. 2. Side view of the assembled structure of the device with germanium grown on the top of the SiOx insulator in a manner such that the later one is deposited on the active layer where the hotspot takes place for a current larger I than the critical current $I_c$, the heat evacuated by phonons toward the substrate.
Figure 3:
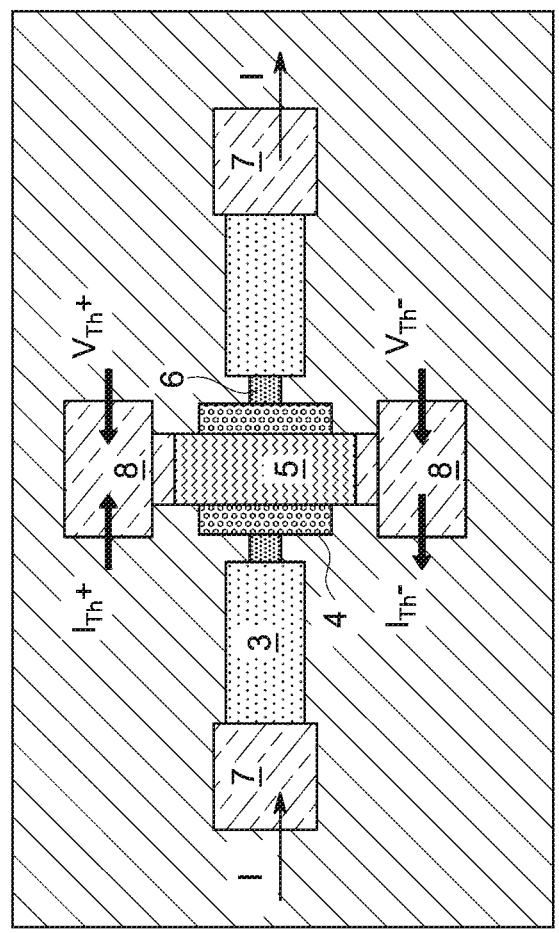
FIG. 3. Top view of the assembled structure of the device in which the resistance of the germanium top layer is measured using four probe technique using input and output currents $I_{Th^-}$ and $I_{Th^+}$, respectively. The later one deposited on the active layer where the hotspot takes in the narrow part at the middle of the active layer place for a current larger I than the critical current $I_c$, the heat is evacuated by phonons toward the substrate.

In the invention, a SiOx insulating layer (4) a few nanometers thick is deposited on the top of the narrow zone in the middle of the superconducting layer or filament (3) see FIG. 2. A germanium layer (5) deposited on the top of the SiOx insulator (4) and serves to record the change of the temperature, see FIGS. 2 and 3. FIGS. 2 and 3 reference characters: (1) cryostat, (2) substrate, (3) superconducting filament or layer, (4) SiOx insulating layer, (5) germanium layer, (6) hotspot, (7) contacts, and (8) contacts for application of dc bias current through Ge layer.

The measurement of the Ge film (5) resistance versus the change of the substrate (2) temperature gives a calibration curve with an applied bias current to the superconducting film or filament (3) smaller than its critical current to avoid an incorrect temperature reading.

The applied current I leads to a thermal dissipation in the normal spot (hotspot) (6), and the power is given by $P_d = V \cdot I$; V the voltage appears after the delay time $t_d$.

The resistance of the germanium film is determined using a four probe technique, where a bias dc current is applied through the film and its corresponding voltage is recorded.

The ratio between the voltage and the current gives the new thermometer resistance; the temperature is determined from the calibrated curve R vs T.

The increase of the Ge resistance upon hotspot creation corresponds with a determination of the temperature reached at the center of hotspot zone. The hotspot heat is evacuated toward the substrate, and this process proceeds by phonon thermal radiation in a certain time $\tau_{es}$. The energy dissipated by Joule effect during this process in the film is equalized to the energy evacuated by the phonon toward the substrate. The latter one uses the constant of the phonon specific heat in the Debye regime, which are known for superconducting materials. Therefore, the heat escape time ($\tau_{es}$) can be determined accurately from this equation. This experimental method is a direct measurement of the heat escape time without any adjustable parameter.

The germanium functions as the temperature sensor; its resistance is a temperature dependent parameter and is sensitive to the heat generated by Joule effect in this zone. The change of its resistance temperature gives the temperature reached at the center of the hotspot.

In contrast to Harrabi, et al., this is a direct reading of the temperate; see K. Harrabi, *Hotspot Temperatures Reached in Current-Driven Superconducting Niobium Filaments*, J. Supercond. Nov. Magn. 26, 1865 (2013); and K. Harrabi, *Temperature Elevation of Current-Driven Phase-Slip Centers in YBa$_2$Cu$_3$O$_7$ Strips*. J. Supercond. Nov. Magn. 28, 573 (2015); where temperature was estimated using the heat escape time as an adjustable parameter from the measurement of the delay time for different current values and then fitted with the TDGL equation.

The measurement of the Ge film resistance versus the substrate temperature provides a calibration curve with an applied bias current of the film smaller than its critical current value to remain in the superconducting state with dissipation.

Once the critical current value Ic is exceeded, the energy dissipated in the normal zone is given by: $P_d = V \cdot I$, where V is the voltage appeared after $t_d$, and I is the applied current to the superconducting filament.

As noted above, the germanium film resistance is determined using a four probe technique, where a bias dc current is applied through the film ($I_{Th^-}$ and $I_{Th^+}$) and the its corresponding voltage is recorded $V_{Th}$ ($V_{Th} = I_{Th^+} - I_{Th^-}$). The ratio between the voltage and the current gives the new thermometer resistance $R_{Th} = V_{Th}/I_{Th}$; the temperature is determined from the calibrated curve $R_{Th}$ vs T, see FIG. 3.

The energy dissipated in the normal zone is evacuated toward the substrate during a certain time $\tau_{es}$ by the thermally excited phonon.

Therefore, the expression of the power is given by $P_e = \sigma_\phi (T^4 - T_0^4)/\tau_{es}$, where $\sigma_\phi$ is the Stefan constant appropriate to acoustic phonons of the superconducting filament. $T_0$ and T are respectively the film substrate temperature and the temperature reached at the center of the hotspot. The heat escape time is deduced from equalizing $P_e$ and $P_d$, and the heat escape time is given by: $\tau_{es} = \sigma_\phi(T^4 - T_0^4)/(V \cdot I)$.

As described above, the invention provides several advantages over the current state of art. It measures the temperature reached at the center of the hotspot created by the absorption of single photon. In addition, the invention provides for the determination of the time needed for the heat to escape form the substrate. The use of the method and/or device provides for the measurement of the time required for a single photon detector to be sensitive to the upcoming one. Therefore, it gives the reset time of the single photon detector on different substrates.

Moreover, the device of the invention has a structured design that requires only a few fabrication steps. It can be fabricated easily using electron beam lithography or photolithography technique.

Various embodiments of the invention are described herein include those described below.

In one aspect the invention includes a device for measuring a temperature at the center of a normal hotspot formed in a superconducting filament and the heat escape time from the filament toward a substrate.

In a further aspect the device includes a germanium layer having at least two ends positioned on top of (or adjacent to) a SiOx insulator which is positioned over a segment of a superconducting filament, which can form a normal hotspot (portion of filament that is not superconducting), which superconducting filament is connected to two contacts and which is positioned over a substrate; wherein the SiOx insulator electrically isolates the germanium layer from the superconducting filament.

In a further aspect the device includes a cryostat below the substrate on the opposite side of the substrate from the superconducting filament. Typically, a cryostat is incorporated with or into a device.

In a further aspect each end of the germanium layer is attached to one of two or more contacts positioned to apply a dc bias current through the germanium layer and wherein each contact comprises a current probe and a voltage probe for measuring voltage and current.

In a further aspect the germanium layer ranges from about 1, 2, 3, 4, 5, 6, 7, 8, 9, 10, 11, 12, 13, 14, 15 or >15 nm and is configured so as to serve as a thermometer and/or temperature sensor. In a further aspect the thin layer of SiOx has a thickness ranging from about 1, 2, 3, 4, 5, 6, 7, 8, 9, 10, 11, 12, 13, 14, 15 or >15 nm and a width of about 5, 10, 15, 20, 25, 30, 35, 40, 45, 50, 55, 60, 65, 70, 75, 80, 85, 90, 95, 100, 105, 110, 115, 120, 125 or >125 μm. These ranges include all intermediate values and subranges. In some embodiments, the substrate is silicon, SiOx, sapphire, magnesium oxide, glass or the like.

In a further aspect the filament is thinner or has a smaller cross-section in its middle than at its ends.

In a further aspect the filament is thinner at its center than at each end or has a cross-section that is at least 25% less than the cross-section of the filament at its ends.

In a further aspect the filament is substantially linear or has a substantially ovoid or circular cross-section.

In a further aspect the filament may have a non-cylindrical cross-section or may have two, three or more narrowed sections.

In a further aspect the filament has an average diameter of about 0.5 to 500 nm. In a further aspect the filament comprises Al, AlN, bismuth strontium calcium copper oxide (BISCCO), Ga, HgTlBaCaCuO, In, MgB$_2$, MoGe, Nb, NbCN, NbN, NbTi, NbTiN, Pb, Sn, WSi, or Yttrium barium copper oxide (YBCuO).

In a further aspect the two contacts at each end of the filament and/or attached to each end of the germanium layer are gold.

In a further aspect gold alloys or other conductive metals or materials may be used such as silver, silver alloys, platinum group metals and carbon.

In a further aspect the two contacts at each end of the germanium layer are positioned to apply a dc bias current through the germanium layer and wherein each contact comprises a current and voltage probe for measuring voltage and current.

Another aspect of the present disclosure includes a method for measuring a temperature at the center of a normal hotspot formed in a superconducting filament and the heat escape time from the filament toward a substrate.

In a further aspect the method includes applying an electrical current pulse above critical current Ic or single photon radiation to the superconducting filament in the device as disclosed herein to produce a normal (non-superconducting) hotspot, measuring resistance in the germanium layer, measuring temperature in the substrate, and calculating the hotspot temperature from the resistance in the germanium layer and from the temperature in the substrate.

In a further aspect the hotspot temperature is calculated from germanium layer resistance which is measured by applying a bias dc current ITh− & ITh+ through the germanium layer and measuring its corresponding voltage VTh, where VTh=ITh+−ITh−.

In a further aspect the heat escape time is calculated by setting $P_e=P_d$, wherein heat escape time $\tau_{es}=\sigma_\phi(T^4-T_0^4)/(V \cdot I)$. $P_e$ is energy dissipated in the normal (nonsuperconducting) zone, $P_d=V \cdot I$, $\tau_{es}$ is the heat escape time, $\sigma\phi$ is the Stefan constant appropriate to acoustic phonons of the superconducting filament, $T_0$ is the substrate temperature, T is the temperature reached at a center of the hotspot, the hotspot voltage at the center of the hotspot and I is the applied current to the superconducting filament.

In a further aspect the method further includes calculating a recovery time for the superconducting filament to return to its initial superconducting state after formation of a normal hotspot.

In a further aspect the recovery time is calculated from the germanium resistance and substrate temperature and the nature of the filament material.

In a further aspect the method further includes calibrating sensitivity of the germanium layer to temperature by measuring its resistance at different temperatures when the superconducting filament does not contain a hotspot and/or preparing a calibration curve that correlates the temperature of the substrate over time to the resistance in the germanium layer.

Another aspect of the invention is directed to a method for selecting a superconducting material for use in a detector, such as a single photon detector comprising incorporating the material being tested into the device of the invention and comparing it to a desired value or to a value measured for a different material or measured for a differently configured material (e.g., a superconducting filament having a different length, depth or width or different geometry) of the same type and selecting the superconducting material having the shorter recovery time.

In still a further aspect of the present disclosure, the invention includes a method for making the device that includes growing the SiOx layer on top of the superconducting filament, growing the germanium layer on top of the SiOx layer on a surface opposite the superconducting filament, and connecting each end of the superconducting filament to a first contact through which a current may be passed to create a hotspot.

The device as described herein may be fabricated using a suitable microfabrication process. According to some embodiments, a layer of a superconducting material on a substrate, such as a silicon, SiOx substrate or glass substrate. In preferred embodiments it will be in a linear, such as in a form of an essentially one dimensional filament or microwire. The superconducting layer is preferably narrow in its center so as to form a segment suitable for induction of a hotspot. The superconducting material may be patterned by e-beam writer, and deposited RF/DC magnetron sputtering, in some implementations. In other embodiments, other materials and microfabrication techniques may be used. For example, a superconductor material comprising YBaCuO, HgTlBaCaCuO, MgB2, BISCCO, Nb, NbTiN, NbCN, Al, AlN, WSi, Ga, In, Sn, Pb, or MoGe may be grown or deposited on a substrate using other techniques, such as chemical vapor deposition, plasma deposition, atomic layer deposition, vapor phase epitaxy, sputtering, etc. In some embodiments, a superconducting material is applied to a substrate, masked leaving voids in the mask so as to form a desired shape such as a shape of a microwire or filament and a resist is applied over the exposed portion of the mask. The mask is removed and the superconducting material applied to the substrate is etched forming the desired shape such as a linear microwire of filament shape. In other embodiments a preformed superconducting filament or microwire may be attached to a substrate.

Once the substrate with the desired shape superconducting material is deposited, an insulating layer of SiOx may be grown on top of it and then a layer of germanium on top of the resulting layered substrate/superconducting material/insulating material. Electron beam lithography or photolithography may be used in the processes described above. Conventional microfabrication processes applicable to one or more of these steps as well as to fabrication of contacts to the superconducting layer or filament or to the germanium layer are described by WO 2014/197047 which is incorporated by reference. Processes and materials for construction of the device are further described by and incorporated by reference to *Adjustment of self-heating in long superconducting thin film NbN microbridges*: Stockhausen, K. Il'in, M. Siegel, U. Sadervall, P. Jedrasik, A. Semenov, and H.-W. Hubers, Supercond. Sci. Technol. 25, 035012 (2012); and *Temperature Profile of Hotspots in Narrow Current-Biased Superconducting Strips*, J. P. Maneval, K. Harrabi, F. Chibane, M. Rosticher, F. R. Ladan, and P. Mathieu, IEEE Trans. Appl. Supercond. 23, 2200604 (2013).

Terminology used herein is for the purpose of describing particular embodiments only and is not intended to be limiting of the invention.

The headings (such as "Background" and "Summary") and sub-headings used herein are intended only for general organization of topics within the present invention, and are not intended to limit the disclosure of the present invention or any aspect thereof. In particular, subject matter disclosed in the "Background" may include novel technology and may not constitute a recitation of prior art. Subject matter disclosed in the "Summary" is not an exhaustive or complete disclosure of the entire scope of the technology or any embodiments thereof. Classification or discussion of a material within a section of this specification as having a particular utility is made for convenience, and no inference should be drawn that the material must necessarily or solely function in accordance with its classification herein when it is used in any given composition.

As used herein, the singular forms "a", "an" and "the" are intended to include the plural forms as well, unless the context clearly indicates otherwise.

It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

As used herein, the term "and/or" includes any and all combinations of one or more of the associated listed items and may be abbreviated as "/".

Links are disabled by deletion of http: or by insertion of a space or underlined space before www. In some instances, the text available via the link on the "last accessed" date may be incorporated by reference.

As used herein in the specification and claims, including as used in the examples and unless otherwise expressly specified, all numbers may be read as if prefaced by the word "substantially", "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), +/−15% of the stated value (or range of values), +/−20% of the stated value (or range of values), etc. Any numerical range recited herein is intended to include all subranges subsumed therein.

Disclosure of values and ranges of values for specific parameters (such as temperatures, molecular weights, weight percentages, etc.) are not exclusive of other values and ranges of values useful herein. It is envisioned that two or more specific exemplified values for a given parameter may define endpoints for a range of values that may be claimed for the parameter. For example, if Parameter X is exemplified herein to have value A and also exemplified to have value Z, it is envisioned that parameter X may have a range of values from about A to about Z.

Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10 it also describes subranges for Parameter X including 1-9, 1-8, 1-7, 2-9, 2-8, 2-7, 3-9, 3-8, 3-7, 2-8, 3-7, 4-6, or 7-10, 8-10 or 9-10 as mere examples. A range encompasses its endpoints as well as values inside of an endpoint, for example, the range 0-5 includes 0, >0, 1, 2, 3, 4, <5 and 5.

As used herein, the words "preferred" and "preferably" refer to embodiments of the technology that afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the technology. As referred to herein, all compositional percentages are by weight of the total composition, unless otherwise specified. As used herein, the word "include," and its variants, is intended to be non-limiting, such that recitation of items in a list is not to the exclusion of other like items that may also be useful in the materials, compositions, devices, and methods of this technology. Similarly, the terms "can" and "may" and their variants are intended to be non-limiting, such that recitation that an embodiment can or may comprise certain elements or features does not exclude other embodiments of the present invention that do not contain those elements or features.

Although the terms "first" and "second" may be used herein to describe various features/elements (including steps), these features/elements should not be limited by these terms, unless the context indicates otherwise. These terms may be used to distinguish one feature/element from another feature/element. Thus, a first feature/element discussed below could be termed a second feature/element, and similarly, a second feature/element discussed below could be termed a first feature/element without departing from the teachings of the present invention.

Spatially relative terms, such as "under", "below", "lower", "over", "upper", "in front of" or "behind" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal" and the like are used herein for the purpose of explanation only unless specifically indicated otherwise.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

The description and specific examples, while indicating embodiments of the technology, are intended for purposes of illustration only and are not intended to limit the scope of the technology. Moreover, recitation of multiple embodiments having stated features is not intended to exclude other embodiments having additional features, or other embodiments incorporating different combinations of the stated features. Specific examples are provided for illustrative purposes of how to make and use the compositions and methods of this technology and, unless explicitly stated otherwise, are not intended to be a representation that given embodiments of this technology have, or have not, been made or tested.

All publications and patent applications mentioned in this specification are herein incorporated by reference in their entirety to the same extent as if each individual publication or patent application was specifically and individually indicated to be incorporated by reference, especially referenced is disclosure appearing in the same sentence, paragraph, page or section of the specification in which the incorporation by reference appears.

The citation of references herein does not constitute an admission that those references are prior art or have any relevance to the patentability of the technology disclosed herein. Any discussion of the content of references cited is intended merely to provide a general summary of assertions made by the authors of the references, and does not constitute an admission as to the accuracy of the content of such references.

The invention claimed is:

1. A device, comprising:
   a germanium layer having two ends, wherein the germanium layer is positioned on top of a SiOx insulator positioned over a segment of a superconducting filament having two ends, wherein the superconducting filament can form a normal hotspot, wherein the germanium layer is connected to two first contacts, and wherein the germanium layer, the SiOx insulator and the sunerconducting filament are positioned over a substrate;
   wherein the SiOx insulator electrically insulates the germanium layer from the superconducting filament and wherein for SiOx x is a real number greater than 0 and smaller than or equal to 2.

2. The device of claim 1, further comprising a cryostat below the substrate on the opposite side of the substrate from the superconducting filament.

3. The device of claim 1, wherein each end of the germanium layer is attached to one of the two first contacts positioned to apply a dc bias current through the germanium layer and wherein each first contact comprises a current probe and a voltage probe for measuring voltage and current.

4. The device of claim 1, wherein the germanium layer has a thickness of from about 2 to about 10 nm and is configured so as to serve as a thermometer or temperature sensor.

5. The device of claim 1, wherein the SiOx insulator has a thickness ranging from about 2 to 10 nm and a width of about 5 to 100 μm.

6. The device of claim 1, wherein the superconducting filament is thinner or has a smaller cross-section in its middle than at its ends.

7. The device of claim 1, wherein the superconducting filament is at least 25% thinner at its center than at each end.

8. The device of claim 1, wherein the superconducting filament is substantially linear or has a substantially ovoid or circular cross-section.

9. The device of claim 1, wherein the superconducting filament has an average diameter of about 0.5 nm to 200 nm.

10. The device of claim 1, wherein the superconducting filament comprises Al, AlN, bismuth strontium calcium copper oxide (BISCCO), Ga, HgTlBaCaCuO, In, $MgB_2$, MoGe, Nb, NbCN, NbN, NbTi, NbTiN, Pb, Sn, WSi, or Yttrium barium copper oxide (YBCuO).

11. The device of claim 1 wherein the two first contacts at each end of the germanium layer are gold, and the ends of the superconducting filament have gold terminals.

12. The device of claim 1, wherein the first contacts at each end of the germanium layer are positioned to apply a dc bias current through the germanium layer and wherein each first contact comprises a current and voltage probe for measuring voltage and current.

* * * * *